(12) United States Patent
Schattner

(10) Patent No.: US 12,543,276 B2
(45) Date of Patent: Feb. 3, 2026

(54) HOUSING DEVICE FOR INSERTION INTO ELECTRICAL JUNCTION BOX

(71) Applicant: SIGNIFY HOLDING B.V., Eindhoven (NL)

(72) Inventor: David Schattner, Newnan, GA (US)

(73) Assignee: SIGNIFY HOLDING B.V., Eindhoven (NL)

( * ) Notice: Subject to any disclaimer, the term of this patent is extended or adjusted under 35 U.S.C. 154(b) by 138 days.

(21) Appl. No.: 18/238,073

(22) Filed: Aug. 25, 2023

(65) Prior Publication Data

US 2025/0071914 A1    Feb. 27, 2025

(51) Int. Cl.
*H05K 5/00* (2025.01)
*H02G 3/08* (2006.01)
*H05K 5/02* (2006.01)

(52) U.S. Cl.
CPC .................. *H05K 5/0047* (2013.01)

(58) Field of Classification Search
CPC .. H05K 5/0047; H05K 5/0247; H05K 5/0052; H02G 3/083; H02G 3/086; H02G 3/085; H02G 3/081; B60R 16/0239
See application file for complete search history.

(56) References Cited

U.S. PATENT DOCUMENTS

| | | |
|---|---|---|
| 4,606,562 A | 8/1986 | Saraceno |
| 2018/0269674 A1* | 9/2018 | Dong ..................... H02G 15/06 |
| 2023/0396046 A1* | 12/2023 | Rugger .................. H02G 3/083 |

FOREIGN PATENT DOCUMENTS

EP    3840150 A1    6/2021

* cited by examiner

*Primary Examiner* — Timothy J Thompson
*Assistant Examiner* — Amol H Patel

(57) ABSTRACT

A housing device for insertion into an electrical junction box. The housing device includes a housing and a nozzle extending from a surface of the housing. The nozzle is sized to provide a first fitment condition for extending through a first aperture in the electrical junction box. The housing has at least two features located on the surface around the nozzle. The at least two features are configured to provide a second fitment condition for extending through a second aperture in the junction box when the housing is inserted therein, the second aperture having a larger diameter than the first aperture.

15 Claims, 9 Drawing Sheets

HOUSING DEVICE FOR INSERTION INTO ELECTRICAL JUNCTION BOX

FIELD OF THE DISCLOSURE

The present disclosure is generally directed to a housing device for insertion into an electrical junction box, and more specifically, a housing for electrical components on a printed circuit board having a nozzle to allow wired connection of the electrical components through a knockout hole in the electrical junction box.

BACKGROUND

Knockouts are commonly used in light fixtures and electrical junction boxes. The knockouts can be removed to provide an aperture for access to the interior of the device, such as the electrical junction box. Knockouts are typically formed in half inch or three-quarter inch trade sizes. Many devices have been formed that include a nozzle for insertion into the aperture formed by a knockout. These nozzles allow for transferring electrical wiring from the attached device into or out of the knockout. However, the nozzle may not always provide a correct fit when extending through the aperture formed by the knockout. For example, a half inch trade size nozzle would not properly center in a three-quarter inch trade size aperture. Thus, installers are required to stock junction boxes having different sized knockouts or adapters that allow for decreasing the size of the knock-out when using a smaller nozzle. In installations where the electrical junction box is already in place, the device may be installed with a poor fit, i.e., the nozzle is not centered within the aperture formed by the knockout.

Accordingly, there is a need in the art for a housing device for insertion into an electrical junction box that is compatible with different sized apertures formed from knockouts in the electrical junction box.

SUMMARY OF THE DISCLOSURE

The present disclosure is directed to a housing device for insertion into an electrical junction box. The housing device includes a housing portion and a nozzle. The housing portion can hold electrical components, such as located on a printed circuit board, and is sized to be inserted in the electrical junction box. The nozzle extends from a surface of the housing portion. The nozzle is sized to provide a first fitment condition for extending through a first aperture in the electrical junction box, such as an aperture generated from a ½ inch trade size knockout. The housing portion has at least two features, such as triangular features, located on the surface around the nozzle, such as on opposing sides of the nozzle. The at least two features are configured to provide a second fitment condition for extending through a second aperture in the junction box, such as an aperture generated from a ¾ inch trade size knockout, when the nozzle portion is inserted therein. The second aperture has a larger diameter than the first aperture.

Accordingly, the housing device can be used with the first aperture and the second aperture of different sizes with the first fitment condition and the second fitment condition are configured to center the nozzle within the first aperture and the second aperture, respectively. Providing the two separate fitment conditions does not require any additional hardware. Thus, the housing device is more versatile and can be utilized with different types of electrical junction boxes having different sized apertures. In some examples, the nozzle is threaded to receive a lock nut to secure the housing to the electrical junction box.

The housing device can be molded with the at least two features located on the surface of the housing portion. The at least two features are configured, such as having a triangular configuration, to provide a draft angle for molding the housing device. The housing device can be formed of a first housing element and a second housing element to be coupled to one another, with the first housing element having a first pair of features and the second housing element having a second pair of features located thereon that symmetrically located on the first housing element and the second housing element, respectively.

Generally, in one aspect, a housing device for insertion into an electrical junction box is provided. The housing device includes a housing portion and a nozzle extending from a surface of the housing portion.

The nozzle is sized to provide a first fitment condition for extending through a first aperture in the electrical junction box. The housing portion has at least two features located on the surface around the nozzle. The at least two features are configured to provide a second fitment condition for extending through a second aperture in the junction box when the nozzle portion is inserted therein. The second aperture has a larger diameter than the first aperture.

According to an example, the first fitment condition and the second fitment condition are configured to center the nozzle within the first aperture and the second aperture, respectively.

According to an example, the at least two features are triangular.

According to an example, the at least two features comprise at least two features located on opposing sides of the nozzle.

According to an example, the nozzle is threaded to receive a lock nut to secure the housing to the electrical junction box.

According to an example, the housing portion is sized to be located in the electrical junction box.

According to an example, the housing device is molded with the at least two features located on the surface of the housing portion.

According to an example, the at least two features are configured to provide a draft angle for molding the housing device.

According to an example, the at least two features are triangular.

According to an example, the nozzle is sized to provide the first fitment condition in the first aperture having a diameter of ½ inch trade size.

According to an example, the at least two features are configured to provide the second fitment condition in the second aperture having a diameter of ¾ inch trade size.

According to an example, the housing device is formed of a first housing element and a second housing element to be coupled to one another.

According to an example, the at least two features comprise at least four features, the first housing element having a first pair of features and the second housing element having a second pair of features located thereon.

According to an example, the first pair of features and the second pair of features are symmetrically located on the first housing element and the second housing element, respectively.

According to an example, the housing portion is configured to house a printed circuit board therein.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

These and other aspects of the various embodiments will be apparent from and elucidated with reference to the embodiment(s) described hereinafter.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the various embodiments.

DETAILED DESCRIPTION OF EMBODIMENTS

The present disclosure is directed to a housing device for insertion into an electrical junction box. The housing device includes a housing portion and a nozzle. The housing portion can hold electrical components, such as located on a printed circuit board, and is sized to be inserted in the electrical junction box. The nozzle extends from a surface of the housing portion. The nozzle is sized to provide a first fitment condition for extending through a first aperture in the electrical junction box, such as an aperture generated from a ½ inch trade size knockout. The housing portion has at least two features, such as triangular features, located on the surface around the nozzle, such as on opposing sides of the nozzle. The at least two features are configured to provide a second fitment condition for extending through a second aperture in the junction box, such as an aperture generated from a ¾ inch trade size knockout, when the nozzle portion is inserted therein. The second aperture has a larger diameter than the first aperture.

Figure 1A:
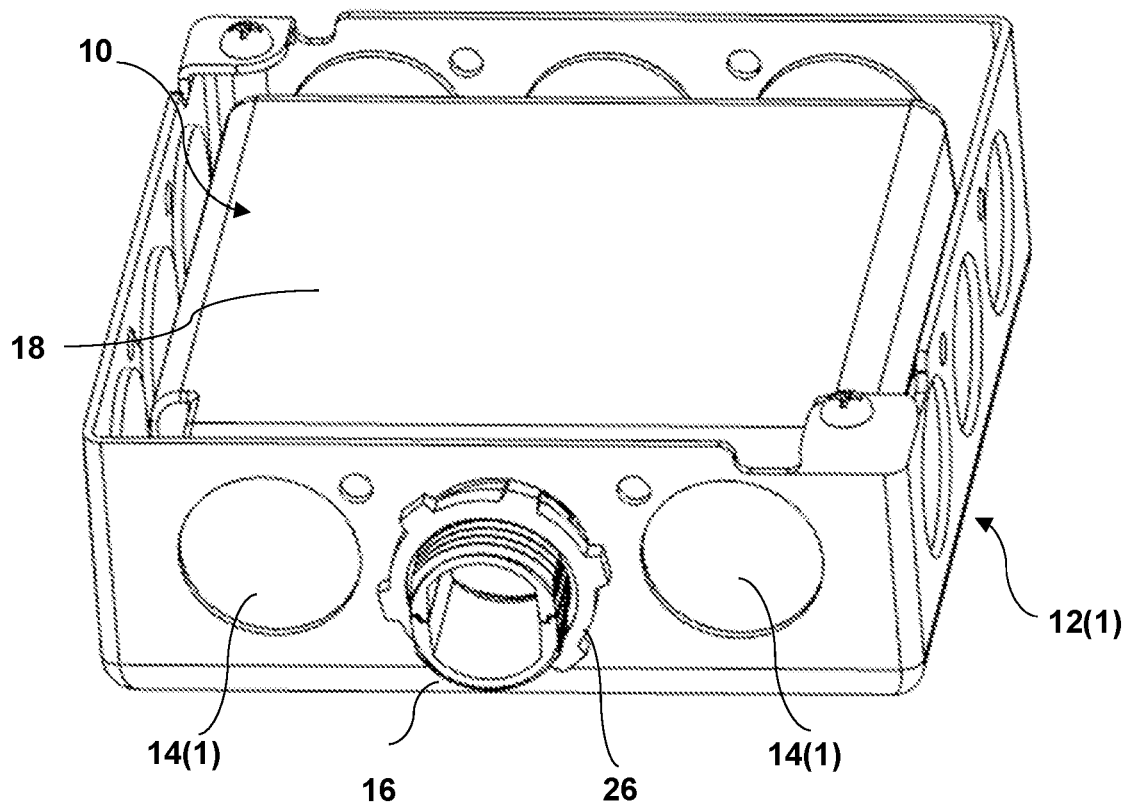
FIG. 1A is an isometric view of an exemplary housing device located in an electrical junction box having a first sized aperture formed from a knockout, according to aspects of the present disclosure.
Figure 1B:
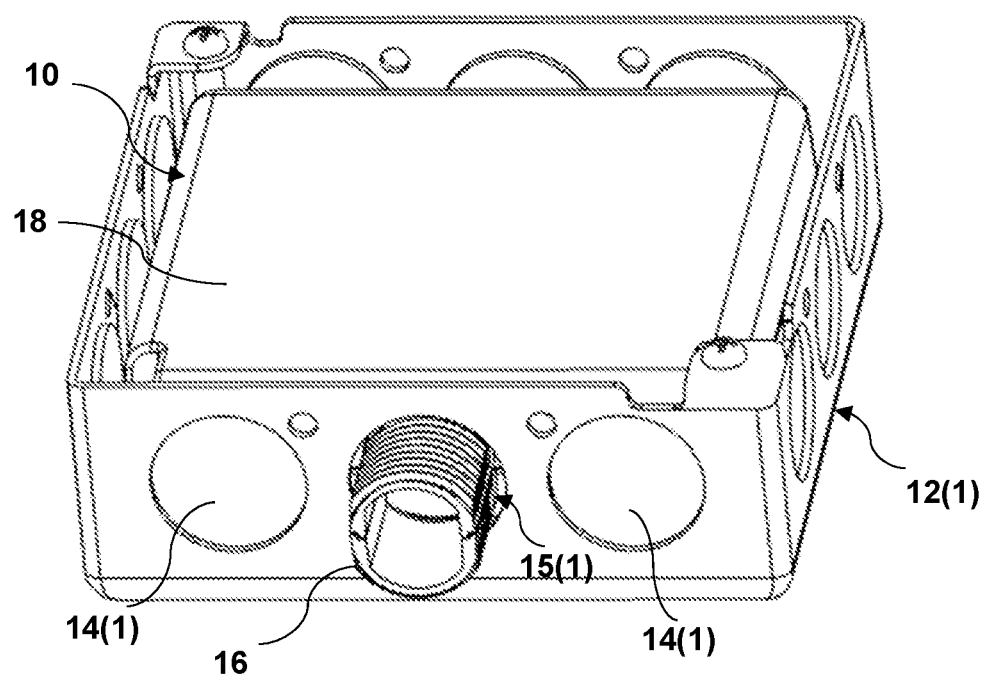
FIG. 1B is an isometric view of the exemplary housing device located in the electrical junction box shown in FIG. 1A with the locking nut removed, according to aspects of the present disclosure.
Figure 1C:
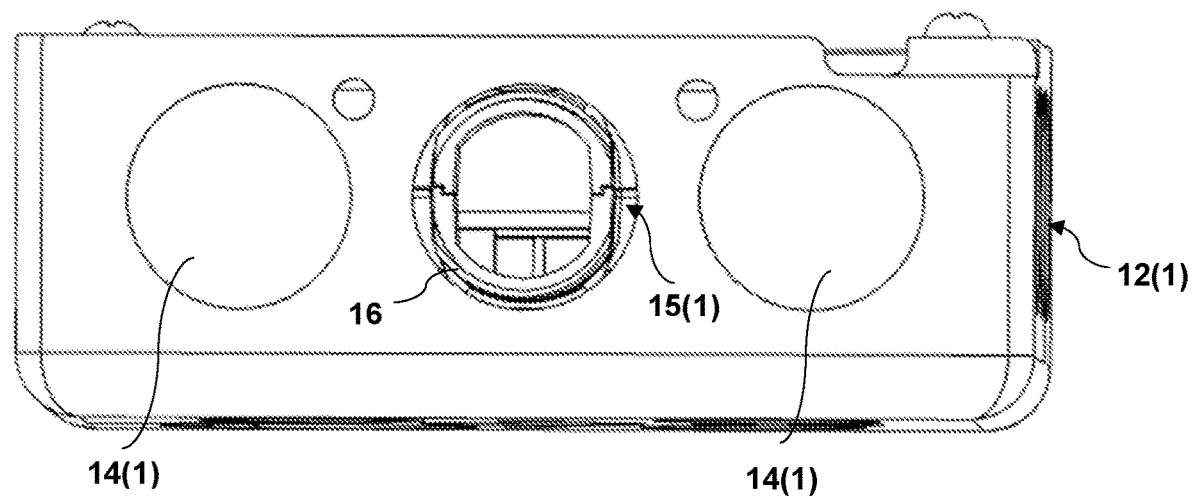
FIG. 1C is a front view of the exemplary housing device located in the electrical junction box shown in FIG. 1A with the locking nut removed, according to aspects of the present disclosure.
Figure 2A:
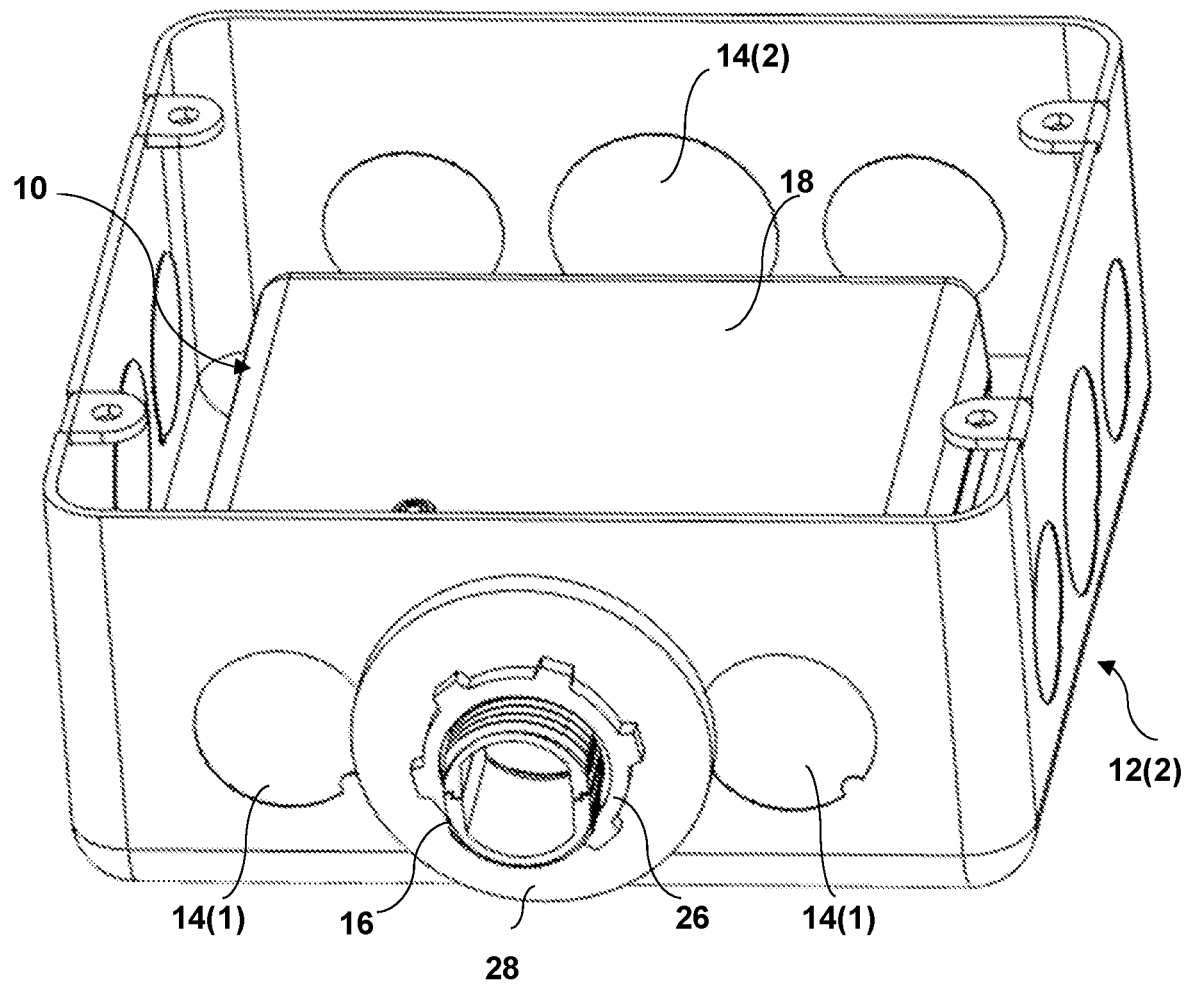
FIG. 2A is an isometric view of the exemplary housing device located in an electrical junction box having a second sized aperture formed from a knockout, according to aspects of the present disclosure.
Figure 2B:
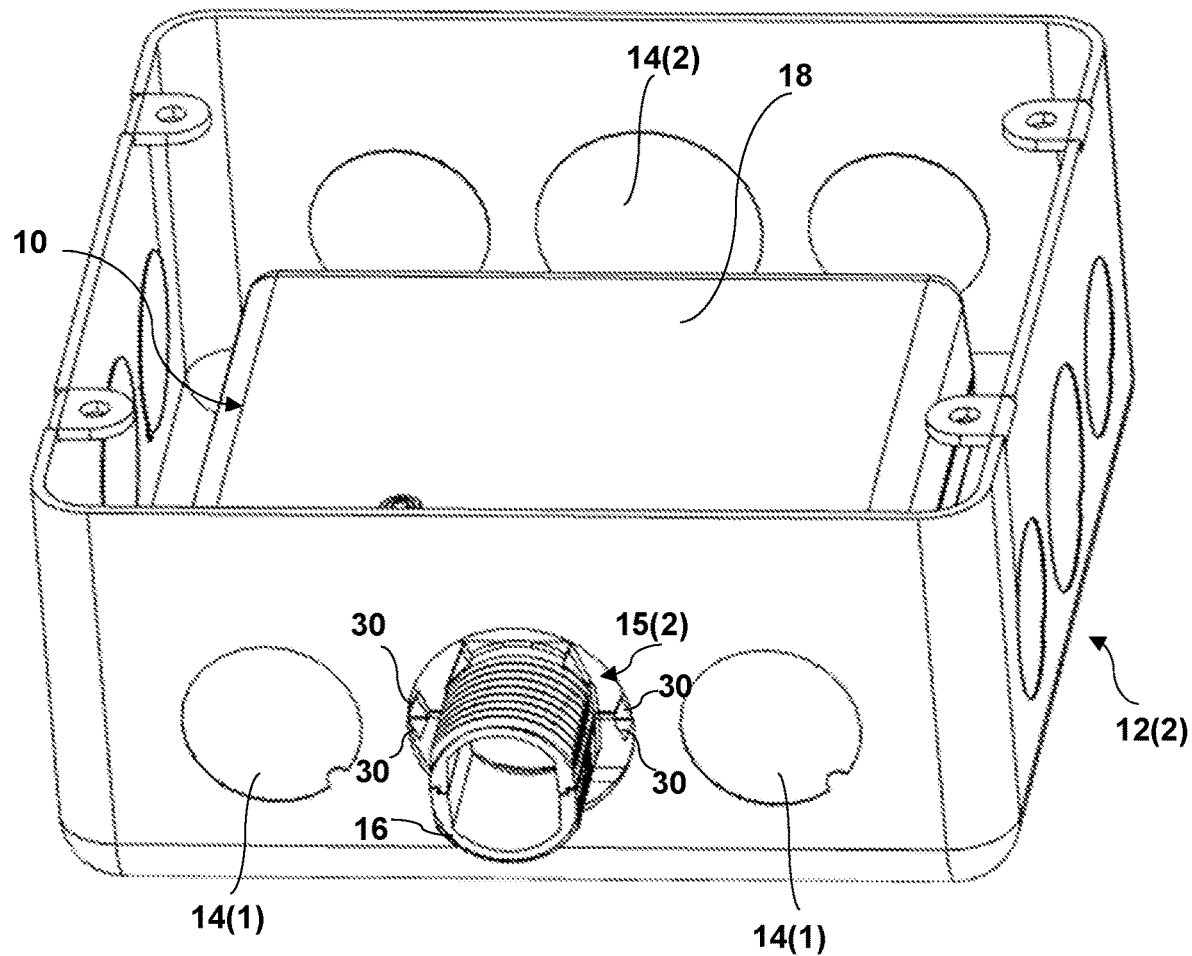
FIG. 2B is an isometric view of the exemplary housing device located in the electrical junction box shown in FIG. 2A with the locking nut and washer removed, according to aspects of the present disclosure.
Figure 2C:
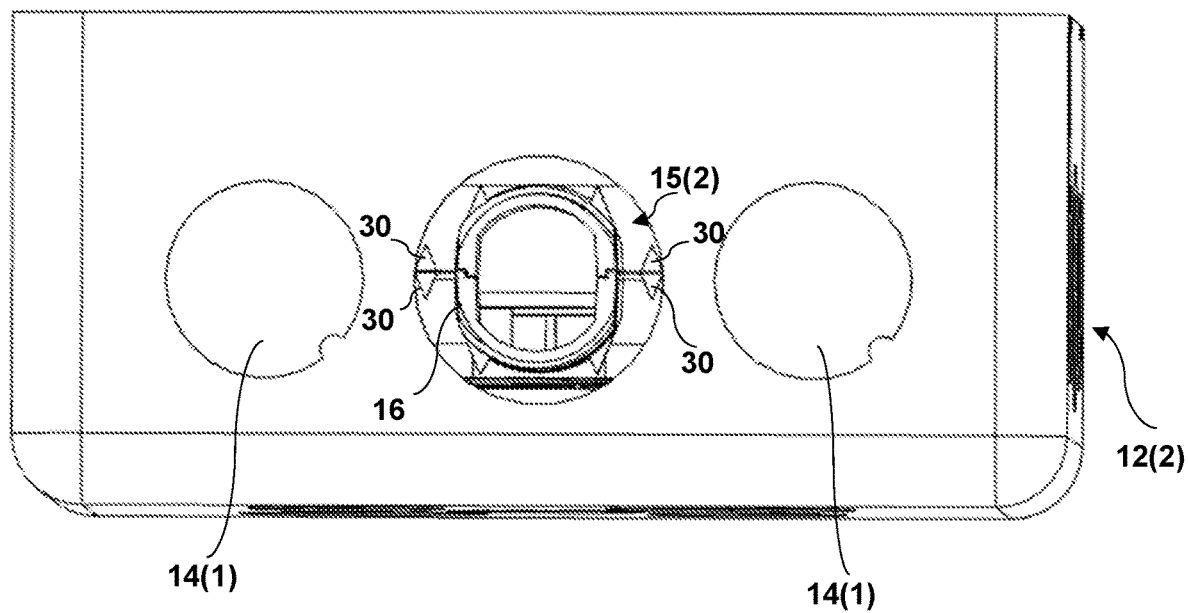
FIG. 2C is a front view of the exemplary housing device located in the electrical junction box shown in FIG. 2A with the locking nut and washer removed, according to aspects of the present disclosure.

FIGS. 1A-1C illustrate an exemplary housing device 10 inserted within a first electrical junction box 12(1) having knockouts 14(1). FIGS. 2A-2C illustrate the housing device 10 positioned within a second electrical junction box 12(2) having both knockouts 14(1) and 14(2). Although the knockouts 14(1) and 14(2) are shown and described, it is to be understood that the first electrical junction box 12(1) and the second electrical junction box 12(2) could have any number of knockouts located on the outer surfaces thereof in various combination. The first electrical junction box 12(1) and the second junction box 12(2) are illustrated with the lids removed for illustration purposes. The first electrical junction box 12(1) and the second electrical junction box 12(2) can be any types or styles of electrical junction boxes known in the art and can be constructed of any materials known in the art. In this example, the knockouts 14(1) and 14(2) are sized to form apertures 15(1) (FIGS. 1B and 1C) and 15(2) (FIGS. 2B and 2C), respectively, when they are removed or punched out. In the examples shown in FIGS. 1A-1C and 2A-2C, the knockouts 14(1) and 14(2) have different sizes. More specifically, the knockout 14(2) has a larger diameter than the knockout 14(1). By way of example only, the knockout 14(1) has a ½ inch trade size diameter, while the knockout 14(2) has a ¾ inch trade size diameter, which are standard knockout sizes in the art. The housing device 10 is advantageously formed, as described in further detail herein, to be employed with either the first electrical junction box 12(1) or the second electrical junction box 12(2) having the respectively sized knockouts 14(1) and 14(2). Although two separate electrical junction boxes are described, it is to be understood that the housing device 10 could be employed with a single junction box having different sized knockouts therein. Also, the housing device 10 could be employed in other devices having knockouts in a similar manner, such as light fixtures, by way of example only.

Figure 3A:
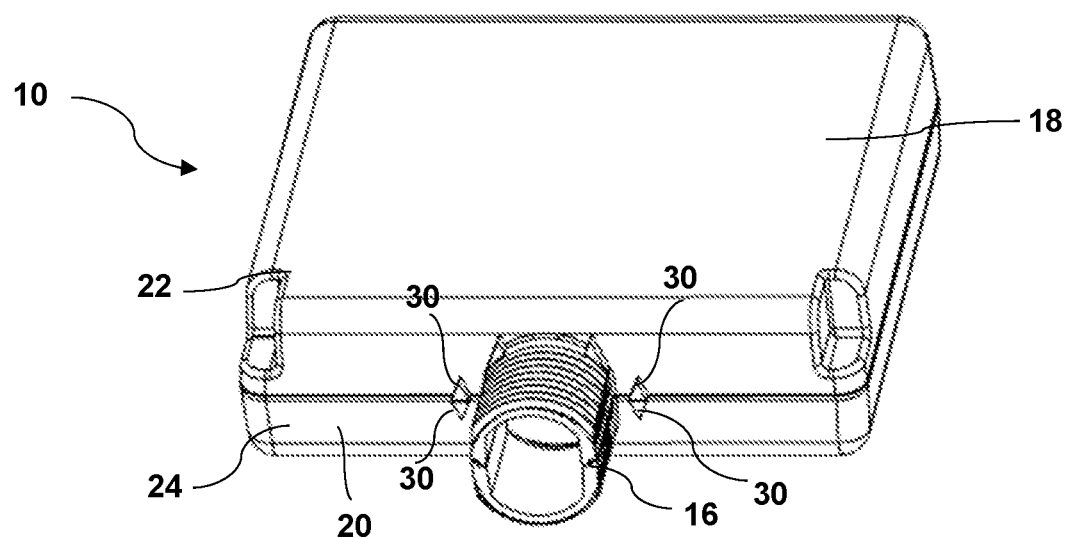
FIG. 3A is an isometric view of the exemplary housing device, according to aspects of the present disclosure.
Figure 3B:
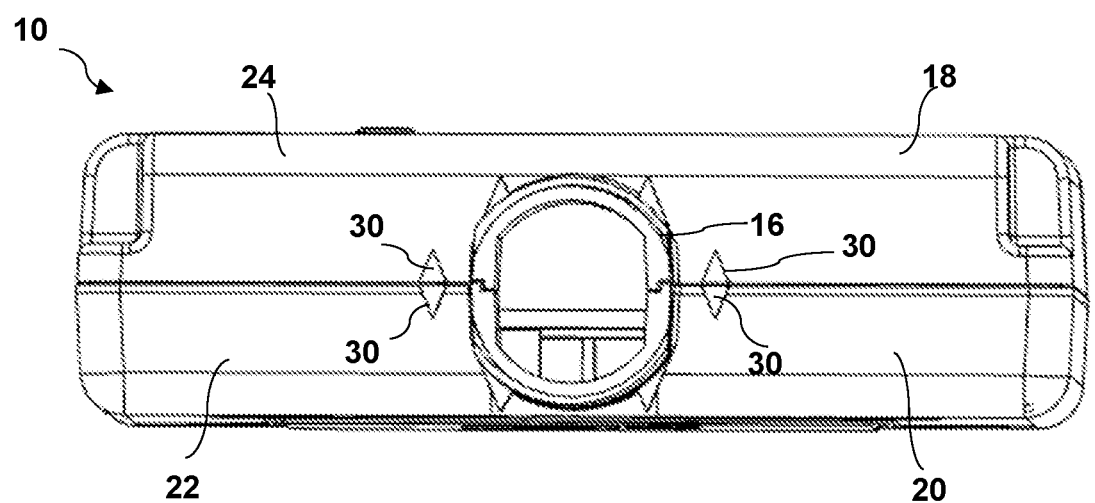
FIG. 3B is a front view of the exemplary housing device shown in FIG. 3A, according to aspects of the present disclosure.

FIGS. 3A and 3B are an isometric view and front view, respectively, of the exemplary housing device 10 for insertion into an electrical junction box. Although, the housing device 10 is described with respect to insertion into an electrical junction box, it is to be understood that the housing device 10 could be inserted in other devices having knockout structures, such as light fixtures, by way of example only.

In this example, the housing device 10 includes a nozzle 16 and a housing portion 18. The nozzle 16 extends from a surface 20 of the housing portion 18. As shown in FIGS. 1A-1C and 2A-2C above, the nozzle 16 is sized to be inserted in either the aperture 15(1) or the aperture 15(2), as described in further detail below. The housing device 10 can be formed of any suitable material, such as a plastic, using a molding process. In this example, the housing device 10 is formed of a first housing element 22 (FIGS. 4A and 4B) and a second housing element 24 (FIGS. 5A and 5B), which can be coupled together in any manner known in the art. The first housing element 22 and the second housing element 24 are joined together to form both the housing portion 18 and the nozzle 16 extending therefrom.

Referring again to FIGS. 3A and 3B, the nozzle 16 has a cylindrical profile and can be inserted into either the aperture 15(1) (as shown in FIGS. 1B and 1C) or the aperture 15(2) (as shown in FIGS. 2B and 2C). The nozzle 16 provides a pathway form making electrical connections between the components located in the housing device 10 either traversing into the electrical junction box or out of the electrical junction box.

Referring to FIGS. 1B and 1C, in this example, the nozzle 16 is sized to provide a first fitment condition in the aperture 15(1). More specifically, the nozzle 16 is sized to have a diameter that is substantially similar to the diameter of the aperture 15(1), such that the nozzle 16 is centered within the aperture 15(1), as shown in FIGS. 1B and 1C. For example, the nozzle 16 can be configured to be inserted in a ½ inch trade size diameter aperture, which is standard in the electrical junction box art, although the nozzle 16 could be sized to be centered within apertures of other sizes. In this example, the nozzle 16 is threaded to receive a lock nut 26 in order to secure the housing device 10 within either the electrical junction box 12(1) (as shown in FIG. 1A) or the electrical junction box 12(2) (as shown in FIG. 2A). Referring to FIG. 2A, a washer 28 can also be employed with the lock nut 26 to help secure the housing device to the electrical junction box 12(2).

Referring again to FIGS. 3A and 3B, the housing portion 18 includes features 30 located on the surface 20 thereof. The features 30 are protrusions extending from the surface 20 and are positioned around the nozzle 18. The features 30 are configured to provide a second fitment condition for the nozzle 16 within a larger aperture, such as the aperture 15(2) of the electrical junction box 12(2), as shown in FIGS. 2B and 2C (the locking nut 26 and the washer 28 are removed for illustration purposes). More specifically, the features 30 contact the outer edges of the aperture 15(2) when the nozzle 16 extends therein in order center the nozzle 16 within the aperture 15(2). At least two features 30 are utilized in order to center the nozzle 16, although additional features could be employed. For example, the features can be configured to be inserted in a ¾ inch trade size diameter aperture, which is standard in the electrical junction box art, although the features 30 could be positioned on the surface 20 to center the nozzle 16 within apertures of other sizes.

In this example, the housing portion 18 includes four triangular features 30 located on opposing sides of the nozzle 16, although other numbers of features having other shapes could be employed. In other examples, two features located on opposing sides of the nozzle 16 can be utilized. The use of triangular features assists in the molding of the housing device 10, as the triangular features advantageously provide draft angles for removing the first housing element 22 and the second housing element 24 from the respective molds.

Figure 4A:
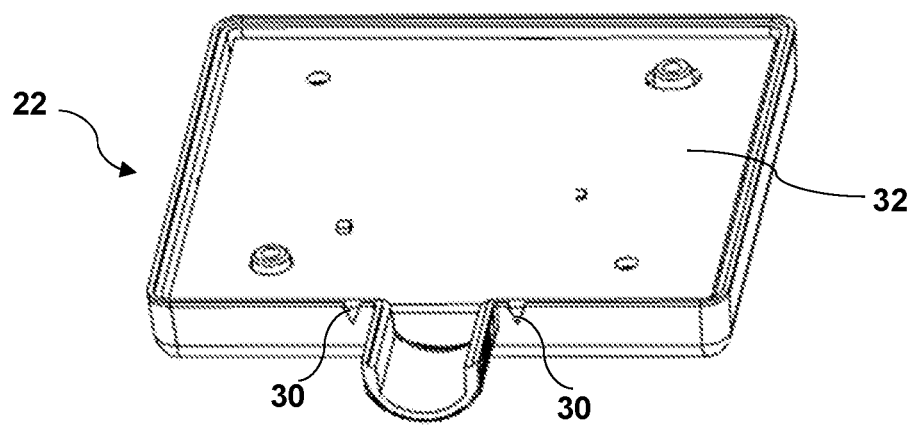
FIG. 4A is an isometric view of a first housing element of the exemplary housing device shown in FIG. 3A, according to aspects of the present disclosure.
Figure 4B:
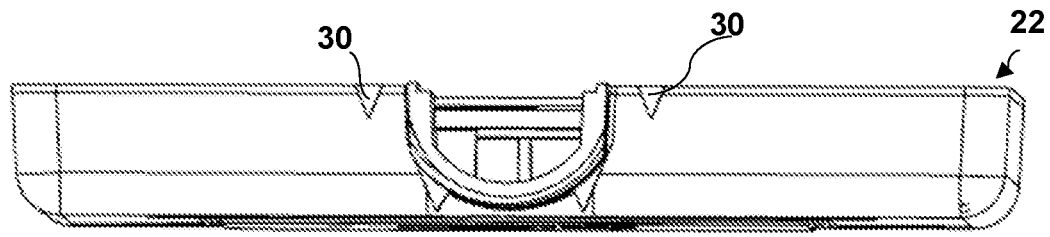
FIG. 4B is a front view of the first housing element shown in FIG. 4A, according to aspects of the present disclosure.
Figure 5A:
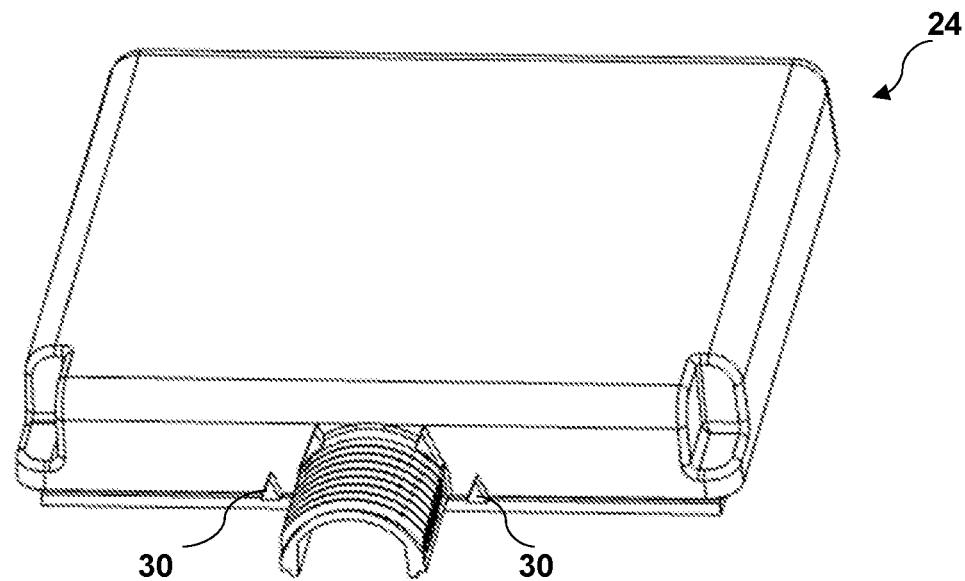
FIG. 5A is an isometric view of a second housing element of the exemplary housing device shown in FIG. 3A, according to aspects of the present disclosure.
Figure 5B:
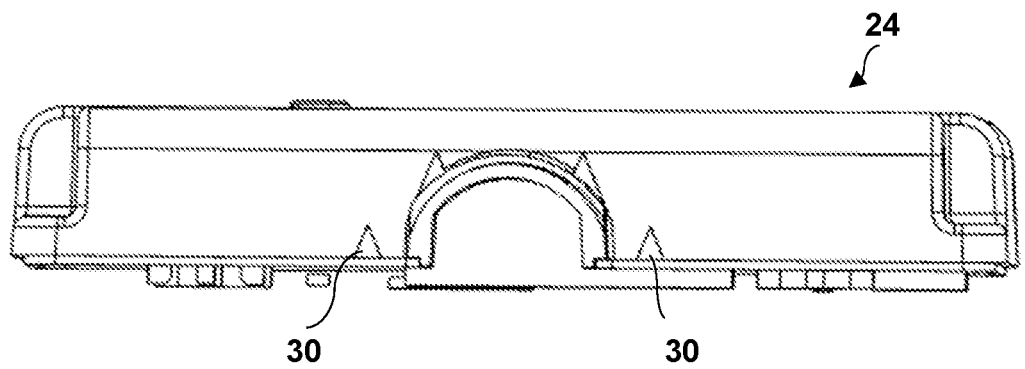
FIG. 5B is a front view of the second housing element shown in FIG. 5A, according to aspects of the present disclosure.

In this example, as shown in FIGS. 4A and 4B, two features 30 are located on the first housing element 22 and as shown in FIGS. 5A and 5B, an additional two features 30 are located on the second housing element 24. The features 30 on the first housing element 22 and the second housing element 24 are located symmetrically such that they align when the first housing element 22 and the second housing element are coupled together.

As shown in FIGS. 1A-1C and 2A-2C, the housing portion 18 can be sized to be located in either the electrical junction box 12(1) or 12(2). In other examples, the nozzle 16 can be inserted into either the electrical junction box 12(1) or 12(2) with the housing portion 18 remaining outside either the electrical junction box 12(1) or 12(2). The housing portion 18 is configured to hold electrical components located on a printed circuit board 32. As shown in FIG. 4A, the printed circuit board 32 can be located within the first housing element 22, by way of example. The printed circuit board 32 can be used to support various electrical components. The second housing element 24 (FIGS. 5A and 5B) can then be attached to the first housing element 24 to form the housing device 10 and protect the printed circuit board 32 within.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements can optionally be present other than the elements specifically identified by the "and/or" clause, whether related or unrelated to those elements specifically identified.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements can optionally be present other than the elements specifically identified within the list of elements to which the phrase "at least one" refers, whether related or unrelated to those elements specifically identified.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The above-described examples of the described subject matter can be implemented in any of numerous ways. For example, some aspects can be implemented using hardware, software, or a combination thereof. When any aspect is implemented at least in part in software, the software code can be executed on any suitable processor or collection of processors, whether provided in a single device or computer or distributed among multiple devices/computers.

The flowchart and block diagrams in the Figures illustrate the architecture, functionality, and operation of possible implementations of systems, methods, and computer program products according to various examples of the present disclosure. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Other implementations are within the scope of the following claims and other claims to which the applicant can be entitled.

While various examples have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the examples described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings is/are used. Those skilled in the art will recognize or be able to ascertain using no more than routine experimentation, many equivalents to the specific examples described herein. It is, therefore, to be understood that the foregoing examples are presented by way of example only and that, within the scope of the appended claims and equivalents thereto, examples can be practiced otherwise than as specifically described and claimed. Examples of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

What is claimed is:

1. A housing device for insertion into an electrical junction box, the housing device comprising:
   a housing portion; and
   a nozzle extending from a surface of the housing portion, the nozzle being sized to provide a first fitment condition for extending through a first aperture in the electrical junction box, the housing portion having at least two features located on the surface around the nozzle, the at least two features configured to provide a second fitment condition for extending through a second aperture in the junction box when the nozzle is inserted therein, the second aperture having a larger diameter than the first aperture.

2. The housing device of claim 1, wherein the first fitment condition and the second fitment condition are configured to center the nozzle within the first aperture and the second aperture, respectively.

3. The housing device of claim 2, wherein the at least two features are triangular.

4. The housing device of claim 2, wherein the at least two features comprise at least two features located on opposing sides of the nozzle.

5. The housing device of claim 1, wherein the nozzle is threaded to receive a lock nut to secure the housing to the electrical junction box.

6. The housing device of claim 1, wherein the housing portion is sized to be located in the electrical junction box.

7. The housing device of claim 1, wherein the housing device is molded with the at least two features located on the surface.

8. The housing device of claim 7, wherein the at least two features are configured to provide a draft angle for molding the housing device.

9. The housing device of claim 8, wherein the at least two features are triangular.

10. The housing device of claim 1, wherein the nozzle is sized to provide the first fitment condition in the first aperture having a diameter of ½ inch trade size.

11. The housing device of claim 1, wherein the at least two features are configured to provide the second fitment condition in the second aperture having a diameter of ¾ inch trade size.

12. The housing device of claim 1, wherein the housing device is formed of a first housing element and a second housing element to be coupled to one another.

13. The housing device of claim 12, wherein the at least two features comprise at least four features, the first housing element having a first pair of features and the second housing element having a second pair of features located thereon.

14. The housing device of claim 13, wherein the first pair of features and the second pair of features are symmetrically located on the first housing element and the second housing element, respectively.

15. The housing device of claim 1, wherein the housing portion is configured to house a printed circuit board therein.

* * * * *